United States Patent
Lee et al.

(10) Patent No.: US 9,268,189 B2
(45) Date of Patent: Feb. 23, 2016

(54) DISPLAY PANEL AND DISPLAY APPARATUS

(71) Applicant: InnoLux Corporation, Jhu-Nan, Miao-Li County (TW)

(72) Inventors: Kuan-Feng Lee, Jhu-Nan (TW); Ming-Chang Lin, Jhu-Nan (TW); Ying-Tong Lin, Jhu-Nan (TW)

(73) Assignee: InnoLux Corporation, Jhu-Nan, Miao-Li County (TW)

( * ) Notice: Subject to any disclaimer, the term of this patent is extended or adjusted under 35 U.S.C. 154(b) by 197 days.

(21) Appl. No.: 14/015,234

(22) Filed: Aug. 30, 2013

(65) Prior Publication Data

US 2014/0063396 A1 Mar. 6, 2014

(30) Foreign Application Priority Data

Sep. 6, 2012 (TW) .............................. 101132494 A

(51) Int. Cl.
  *G02F 1/136* (2006.01)
  *G09G 3/36* (2006.01)
  *H01L 29/04* (2006.01)
  *G02F 1/1368* (2006.01)
  *H01L 27/12* (2006.01)
  *G02F 1/1362* (2006.01)

(52) U.S. Cl.
  CPC ........ *G02F 1/1368* (2013.01); *G02F 1/136227* (2013.01); *H01L 27/124* (2013.01)

(58) Field of Classification Search
  CPC .................................................... G02F 1/1368
  USPC ........................................................ 349/42–43
  See application file for complete search history.

(56) References Cited

U.S. PATENT DOCUMENTS

| 7,342,247 B2* | 3/2008 | Lee et al. ......................... 257/40 |
| 7,439,090 B2* | 10/2008 | Tung et al. ...................... 438/30 |
| 2002/0012083 A1 | 1/2002 | Tanaka et al. |
| 2003/0013236 A1* | 1/2003 | Nakata et al. ................. 438/149 |
| 2007/0070266 A1* | 3/2007 | Ochiai et al. .................. 349/106 |
| 2009/0029530 A1 | 1/2009 | Kunii |
| 2011/0220888 A1 | 9/2011 | Choi et al. |

FOREIGN PATENT DOCUMENTS

| EP | 0 708 355 A2 | 4/1996 |
| EP | 0 780 355 A2 | 4/1996 |

* cited by examiner

*Primary Examiner* — Hoan C Nguyen
(74) *Attorney, Agent, or Firm* — Muncy, Geissler, Olds & Lowe, P.C.

(57) ABSTRACT

A display panel includes a thin film transistor substrate, an opposite substrate and a liquid crystal layer. A thin film transistor is disposed on a substrate and has a drain. A first insulating layer is disposed on the drain and has a first via above the drain. A planarization layer is disposed on the first insulating layer and has a second via above the drain. The first via and the second via are partially overlapped to form an overlap portion. A second insulating layer is disposed on the planarization layer. A pixel electrode layer is disposed on the second insulating layer and in the overlap portion to connect to the drain. The opposite substrate is disposed opposite to the thin film transistor substrate. The liquid crystal layer is disposed between the thin film transistor substrate and the opposite substrate.

18 Claims, 6 Drawing Sheets

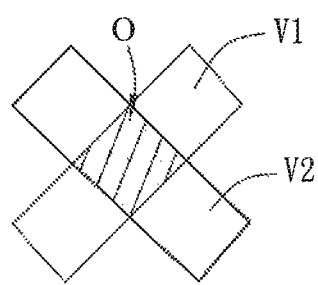
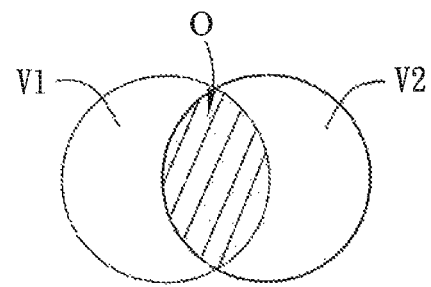
FIG.2A                FIG.2B
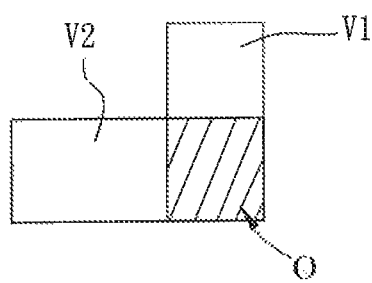
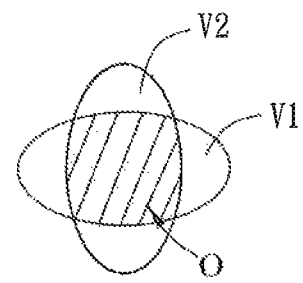
FIG.2C                FIG.2D

DISPLAY PANEL AND DISPLAY APPARATUS

CROSS REFERENCE TO RELATED APPLICATIONS

This Non-provisional application claims priority under 35 U.S.C. §119(a) on Patent Application No(s). 101132494 filed in Taiwan, Republic of China on Sep. 6, 2012, the entire contents of which are hereby incorporated by reference.

BACKGROUND

1. Technical Field

The disclosed embodiments relate to a display panel and a display apparatus having the display panel.

2. Related Art

With the progress of technologies, display apparatuses have been widely applied to all kinds of fields. Especially, liquid crystal display (LCD) apparatuses, having advantages such as compact structure, low power consumption, light weight and less radiation, gradually take the place of cathode ray tube (CRT) display devices, and are widely applied to various electronic products, such as Mobile phones, portable multimedia devices, notebooks, LCD TVs and LCD screens.

For a conventional LCD apparatus, it includes a thin film transistor (TFT) substrate, and the TFT substrate includes a TFT and a pixel electrode disposed on a substrate. In the manufacturing process thereof, a via is formed above the drain of the TFT by etching, and a transparent conductive layer is disposed through the via to electrically connect the drain of the TFT and the pixel electrode. Besides, the gate of the TFT is electrically connected to a scan line while the source of the TFT is electrically connected to a data line. Accordingly, when a scan signal is transmitted to the gate of the TFT through the scan line, the TFT is controlled so that the data voltage of the data line can be transmitted to the pixel electrode through the source, drain and transparent conductive layer, thereby controlling the orientation of the liquid crystal for displaying images.

In the conventional art, the via is formed by etching an insulating layer and a planarization layer, which are both disposed above the drain. The insulating layer is disposed on the drain, and the planarization layer is disposed above the insulating layer. The manufacturing steps of the via is described as below. First, a bigger-size first via is formed by etching the planarization layer, and thus exposes the insulating layer. Then, the second etching is conducted in the first via for removing the insulating layer so that the drain is exposed and a second via is thus formed. The above-mentioned steps can be analogized with a concentric-circle method wherein the inner circle denotes the second via and the outer circle denotes the first via. When the vias are formed, the transparent conductive layer is disposed in the vias to electrically connect the drain and the pixel electrode.

However, for conveniently disposing the second via in the first via, the first via needs to be extended in dimensions, and therefore, the light leakage is caused because of the liquid crystal molecules standing obliquely at the edge of the first via. Hence, the black matrix layer in the opposite substrate needs to be extended in width corresponding to the edge of the first via for blocking the light leakage, but this will decrease the aperture ratio of the pixel of the LCD apparatus.

Therefore, it is an important subject to provide a display panel and a display apparatus that have a smaller-size via for a larger aperture ratio of the pixel.

SUMMARY

In view of the foregoing subject, an objective of the disclosure is to provide a display panel and a display apparatus that have a smaller-size via for a larger aperture ratio of the pixel.

To achieve the above objective, a display panel according to the embodiments of the disclosure includes a thin film transistor (TFT) substrate, an opposite substrate and a liquid crystal layer. The thin film transistor substrate includes a substrate, a thin film transistor, a first insulating layer, a planarization layer, a second insulating layer and a pixel electrode layer. The thin film transistor is disposed on the substrate and has a drain. The first insulating layer is disposed on the drain and has a first via above the drain. The planarization layer is disposed on the first insulating layer and has a second via above the drain. The first via and the second via are partially overlapped to form an overlap portion. The second insulating layer is disposed on the planarization layer. The pixel electrode layer is disposed on the second insulating layer and in the overlap portion to connect to the drain. The opposite substrate is disposed opposite to the thin film transistor substrate. The liquid crystal layer is disposed between the thin film transistor substrate and the opposite substrate.

To achieve the above objective, a display apparatus according to the embodiments of the disclosure includes a thin film transistor substrate, an opposite substrate, a liquid crystal layer and a backlight module. The thin film transistor substrate includes a substrate, a thin film transistor, a first insulating layer, a planarization layer, a second insulating layer and a pixel electrode layer. The thin film transistor is disposed on the substrate and has a drain. The first insulating layer is disposed on the drain and has a first via above the drain. The planarization layer is disposed on the first insulating layer and has a second via above the drain. The first via and the second via are partially overlapped to form an overlap portion. The second insulating layer is disposed on the planarization layer. The pixel electrode layer is disposed on the second insulating layer and in the overlap portion to connect to the drain. The opposite substrate is disposed opposite to the thin film transistor substrate. The liquid crystal layer is disposed between the thin film transistor substrate and the opposite substrate. The backlight module is disposed on a side of the thin film transistor substrate facing away from the opposite substrate.

As mentioned above, according to a display panel and a display apparatus of the embodiments of the disclosure, the TFT substrate includes a first insulating layer and a planarization layer, the first insulating layer has a first via above the drain, the planarization layer has a second via above the drain, and the first via and the second via partially overlap to form an overlap portion. Besides, the pixel electrode layer is disposed on the second insulating layer and partially in the overlap portion to connect the drain. Thereby, in comparison with the conventional art, the overlap portion of the first and second vias according to the disclosure is less in dimensions, so that the coverage of the black matrix layer is reduced. Therefore, the display panel and the display apparatus according to the disclosure can have larger aperture ratio of the pixel.

BRIEF DESCRIPTION OF THE DRAWINGS

The invention will become more fully understood from the detailed description and accompanying drawings, which are given for illustration only, and thus are not limitative of the present invention, and wherein:

FIGS. 2A to 2D are schematic diagrams of some variations of the first and second vias and their relations;

DETAILED DESCRIPTION

The present invention will be apparent from the following detailed description, which proceeds with reference to the accompanying drawings, wherein the same references relate to the same elements.

A display panel according to an embodiment of the disclosure is an active matrix liquid crystal display (LCD) panel, and includes a thin film transistor (TFT) substrate 1. Here, the structure of the TFT substrate 1 is first illustrated.

Figure 1A:
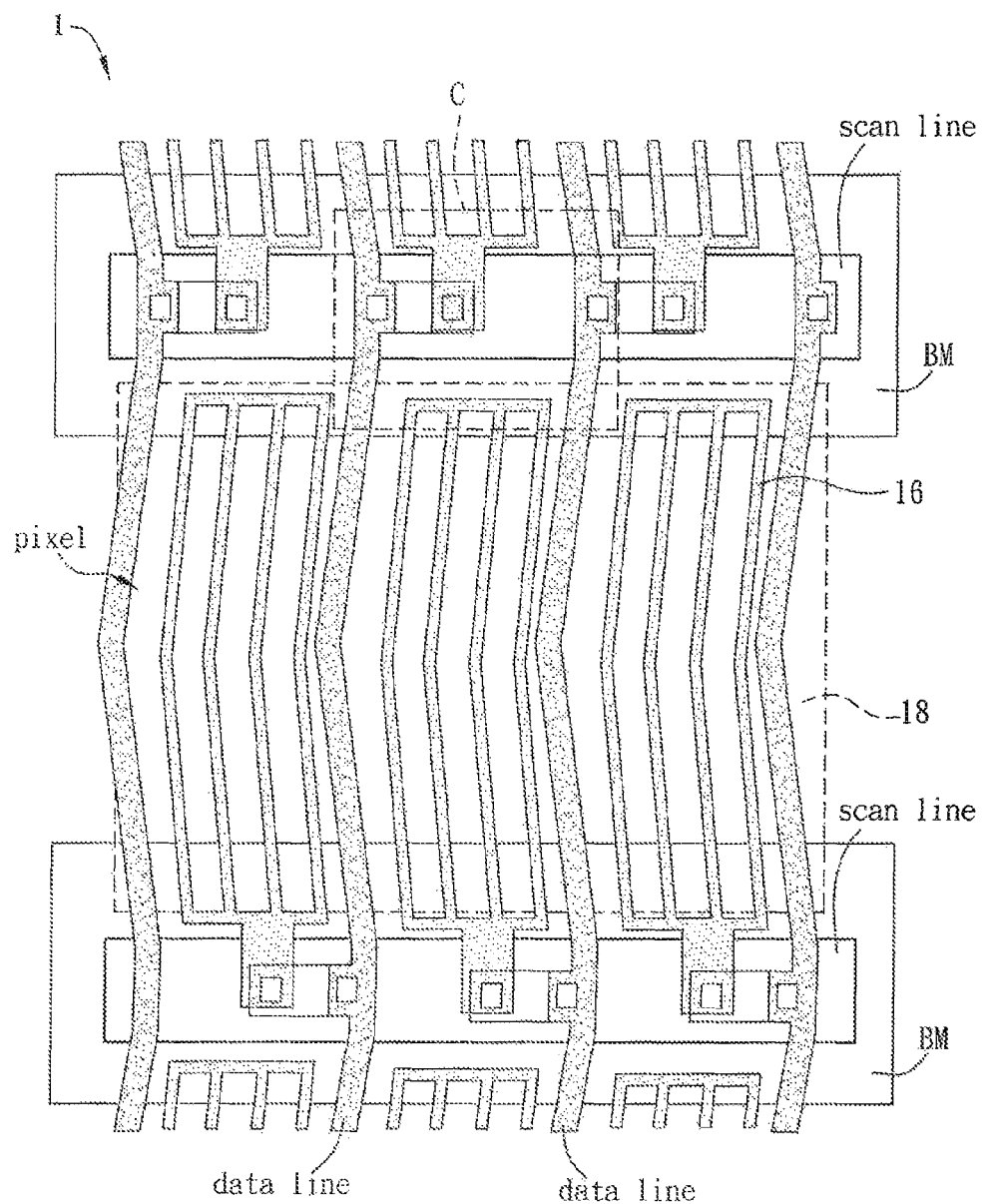
FIG. 1A is a schematic top-view of a TFT substrate according to an embodiment of the disclosure.
Figure 1B:
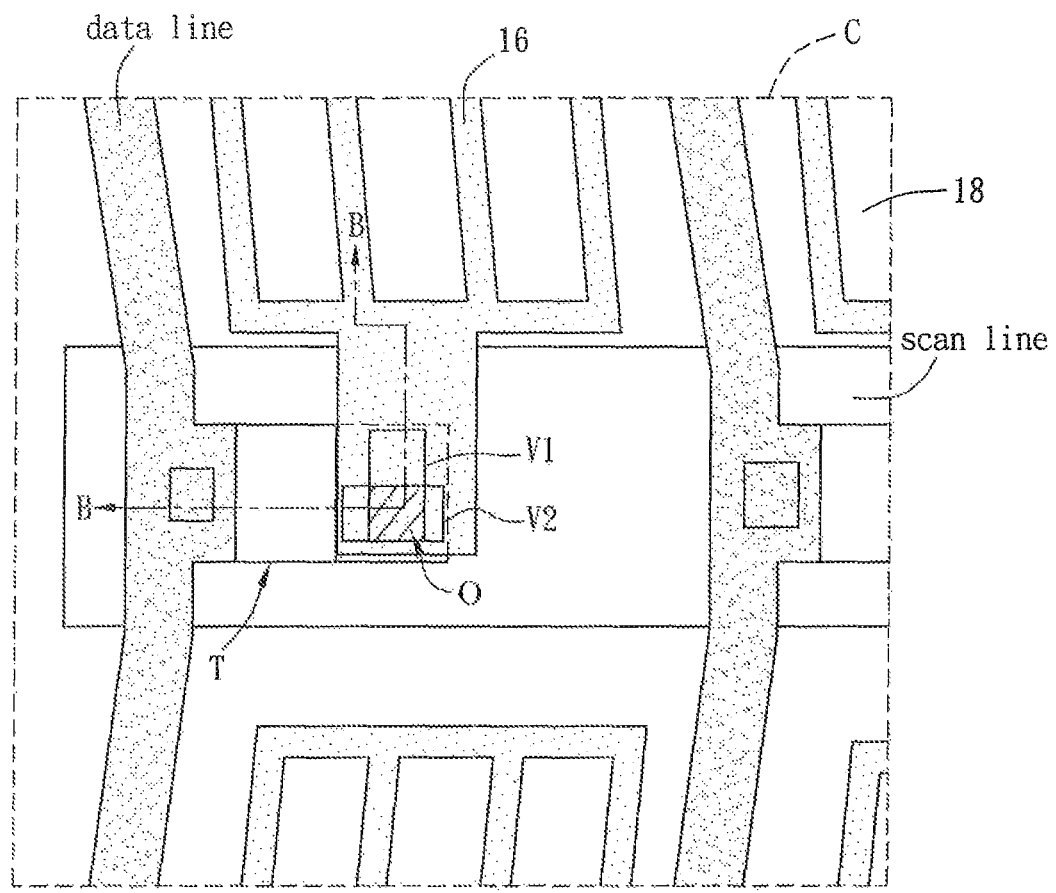
FIG. 1B is an enlarged diagram of the region C in FIG. 1A.
Figure 1C:
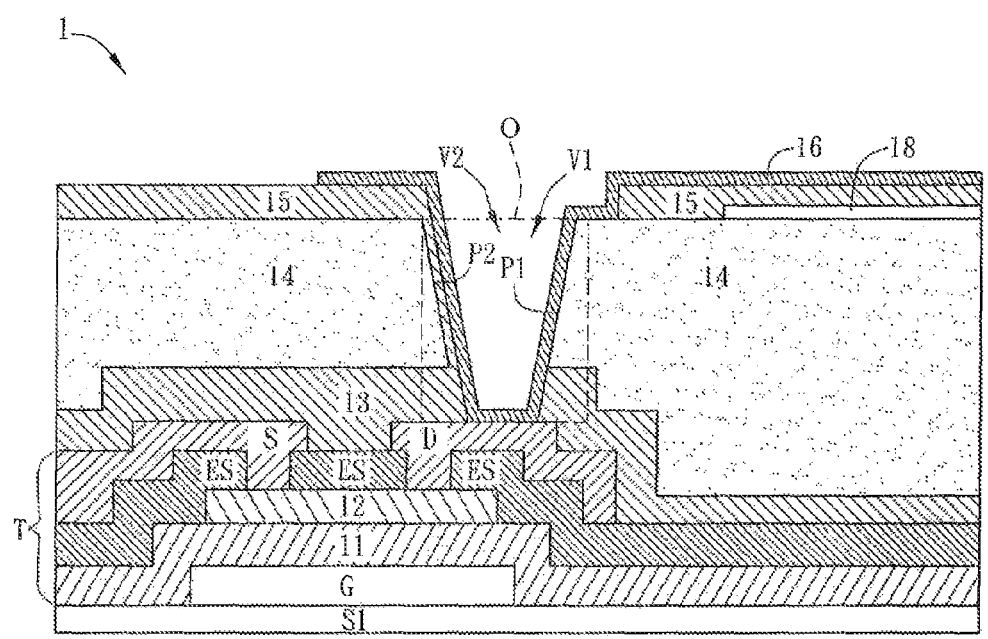
FIG. 1C is a sectional diagram taken along the line B-B in FIG. 1B.

FIG. 1A is a schematic top-view of the TFT substrate 1, FIG. 1B is an enlarged diagram of the region C in FIG. 1A, and FIG. 1C is a sectional diagram taken along the line B-B in FIG. 1B. To be noted, the dimensions of all elements shown in FIGS. 1A to 1C are just for example, but not for showing the actual case.

In FIG. 1A, the TFT substrate 1 can include a plurality of scan lines, a plurality of data lines and a plurality of pixels (only two scan lines and four data lines are shown in FIG. 1A). The scan lines and the data lines cross each other to form the pixels. The scan lines can be sequentially enabled by receiving the respective scan signals, then the data signals can be transmitted to the pixels through the data lines, and thereby the display panel can display images. The data line in FIG. 1A is a bent line, but however, it can be a straight line or formed otherwise in other embodiments. Besides, the TFT substrate 1 can further include a black matrix layer BM, which is disposed above the scan lines for covering the region of the scan lines and preventing the light leakage of the pixels. Of course, the black matrix layer BM also can be disposed to an opposite substrate of the LCD panel, and here the black matrix layer BM is disposed to the TFT substrate 1 for example.

In FIG. 1C, the TFT substrate 1 includes a substrate S1, a thin film transistor T, a first insulating layer 13, a planarization layer 14, a second insulating layer 15, a pixel electrode layer 16, and a common electrode layer 18.

The thin film transistor T is disposed on the substrate S1. As an embodiment, the substrate S1 can be made by transparent material, and applied to a transmissive display apparatus. The transparent material is, for example, glass, quartz or the like, plastic material, rubber, fiberglass or other polymer material. Preferably, the substrate S1 is an alumino silicate glass substrate. Otherwise, the substrate S1 can be made by opaque material, and applied to a self-luminous or reflective display apparatus. In this case, the substrate S1 is a metal-fiberglass composite plate or a metal-ceramic composite plate for example.

The thin film transistor T has a gate G, a gate dielectric layer 11, a channel layer 12, a source S and a drain D. The gate G is disposed on the substrate S1, and the gate G is a single-layer or multi-layer structure composed of metal (e.g. aluminum, copper, silver, molybdenum, or titanium), alloy or their any combinations. Some of the conductive wires, such as scan lines, for transmitting driving signals can be made by the same process as the gate G and into the same layer as the gate G, electrically connected to the gate G. The gate dielectric layer 11 is disposed on the gate G, and can be made by organic material such as organic silicone compound, or inorganic material such as silicon nitride, silicon oxide, silicon oxynitride, silicon carbide, aluminum oxide, hafnium oxide or their any combinations. The gate dielectric layer 11 can be a single-layer or multi-layer structure. The gate dielectric layer 11 needs to completely cover the gate G, and can cover the partial or whole substrate S1.

The channel layer 12 is disposed on the gate dielectric layer 11 and corresponding to the gate G. As an embodiment, the channel layer 12 can contain an oxide semiconductor for example. The oxide semiconductor contains an oxide, which includes one of indium, gallium and zinc and can be indium gallium zinc Oxide (IGZO) for example.

The source S and the drain D are disposed on the channel layer 12, and contact the channel layer 12. When the channel layer of the thin film transistor T is not enabled, the source S and the drain D are separated electrically. The source S and the drain D each can be made into a single-layer or multi-layer structure composed of metal (e.g. aluminum, copper, silver, molybdenum, or titanium), alloy or their any combinations. Besides, some of the conductive wires, such as data lines, for transmitting driving signals can be made by the same process as the source S and the drain D and into the same layer as the source S and the drain D.

To deserve to be mentioned, the source S and the drain D are disposed on an etch stop layer ES, and respectively contact the channel layer 12 through the openings of the etch stop layer ES. The etch stop layer ES can be made by organic material such as organic silicone compound, or inorganic material such as silicon nitride, silicon oxide, silicon oxynitride, silicon carbide, aluminum oxide, hafnium oxide or their any combinations. The etch stop layer ES can be a single-layer or multi-layer structure. In other embodiments, the source S and the drain D can be directly disposed on the channel layer 12 instead of through the etch stop layer ES.

In FIGS. 1B and 1C, the first insulating layer 13 is disposed on the drain D, and covers at least a part of the drain D. The first insulating layer 13 has a first via V1 above the drain D. The planarization layer 14 is disposed on the first insulating layer 13, and has a second via V2 above the drain D. The first via V1 and the second via V2 can have the same or different dimensions. Here, the top-views of the first via V1 and the second via V2 are each a rectangle for example. The first via V1 and the second via V2 partially overlap to form an overlap portion O (as shown by the region O in FIG. 1B). In other words, the projections of the first via V1 and the second via V2 on the substrate S1 of the TFT substrate 1 are partially overlapped. Besides, the overlap portion O can have an area between 4 square microns and 49 square microns.

The ratio of the area of the overlap portion O to the area of the first via V1 can be 0.14~0.78. The ratio of the area of the overlap portion O to the area of the second via V2 also can be 0.14~0.78. The above-mentioned area can be a sectional area or a projection area. The area of the overlap portion O is 9 square microns, and the area of the first via V1 is 36 square microns, for example. In comparison with the conventional art that a via is formed by etching the inside of another via, the overlap portion O of the first via V1 and the second via V2 of an embodiment of this disclosure has a less area than the conventional via, and the alignment problem between the larger via and the smaller via in the conventional art will not occur in this disclosure. Besides, because the overlap portion O has a less area than the conventional via, the width of the black matrix BM covering the scan lines can be made smaller than the conventional case, and thereby the aperture ratio of the pixel of the display panel is increased. To be noted, the width of the overlap portion O of the first and second vias V1 and V2 can be between 2 microns and 8 microns for facilitating the following process.

FIGS. 2A to 2D are schematic diagrams of some variations of the first and second vias V1 and V2 and their relations.

Each of the first via V1 and the second via V2 can have a polygonal form (FIGS. 2A and 2C), a circular form (FIG. 2B), an elliptic form (FIG. 2D), or an irregular form. Among FIGS. 2A to 2D, the better case regarding the overlap of the first via V1 and the second via V2 is shown by FIG. 2A, and that is, the first via V1 and the second via V2 both have a rectangular form and the overlap portion O is located at the central parts of the first via V1 and the second via V2. Therefore, the alignment problem between the larger via and the smaller via in the conventional art can be diminished so that the conductive function of the transparent conductive layer formed subsequently can be kept effective (if the alignment is not good, the disposition of the transparent conductive layer may be negatively affected, and the electrical connection of the drain and the pixel electrode is thus negatively affected).

In FIG. 1C, the second insulating layer 15 is disposed on the planarization layer 14, and the pixel electrode layer 16 is disposed on the second insulating layer 15. Herein, the pixel electrode layer 16 is pectinate for example. The pixel electrode layer 16 is disposed in the first via V1 and the second via V2, and can electrically connect to the drain D through the overlap portion O of the first and second vias V1 and V2. The pixel electrode layer 16 can include a transparent conductive material, such as ITO, IZO, AZO, CTO, SnO2, or ZnO.

To deserve to be mentioned, when the insulating layer is etched in the conventional art, a square edge or a chamfer is easily formed at the edge of the via, resulting in some gaps therein. Therefore, the transparent conductive layer is easily broken when formed in the via, so that the yield is decreased. However, in this disclosure, the partial pixel electrode layer 16 is disposed at a first edge P1 (shown by the right edge of the via in FIG. 1C) of the overlap portion O of the first and second vias V1 and V2, directly contacting the planarization layer 14. Furthermore, the partial second insulating layer 15 is disposed at a second edge P2 (shown by the left edge of the via in FIG. 1C) of the overlap portion O of the first and second vias V1 and V2, directly contacting the planarization layer 14. The portion of the second insulating layer 15 at the second edge P2 can connect the portions of the insulating layer above and below the planarization layer 14, so that the amount of the gaps is reduced and less than the conventional art. Accordingly, when the pixel electrode layer 16 is formed, the probability that the pixel electrode layer 16 is broken can be reduced a lot, and thereby the process yield can be increased.

Besides, the common electrode layer 18 is disposed between the planarization layer 14 and the second insulating layer 15.

Figure 3:
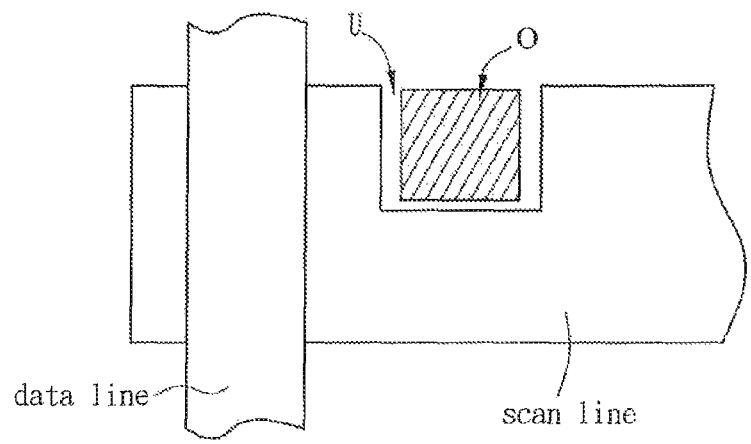
FIG. 3 is a display apparatus according to an embodiment of the disclosure.

In other embodiments, as shown in FIG. 3, because the area of the overlap portion O of the first and second vias V1 and V2 is less than the conventional via, the scan line can have an indentation U (i.e. the scan line is partially removed to form the indentation U) near the intersection of the scan line and the data line, and the indentation U can be disposed at the overlap portion of the first and second vias V1 and V2 (FIG. 3 only shows the overlap portion O of the first and second vias V1 and V2, but doesn't show the top-views of the first and second vias V1 and V2). Accordingly, because the area of the overlap portion O of the first and second vias V1 and V2 is less than the conventional via, the indentation U will not be too large make the scan line break, but instead the scan line has a smaller width at the indentation U. Thereby, the coupling capacitance formed between the scan line and the data line can be reduced.

Figure 4:
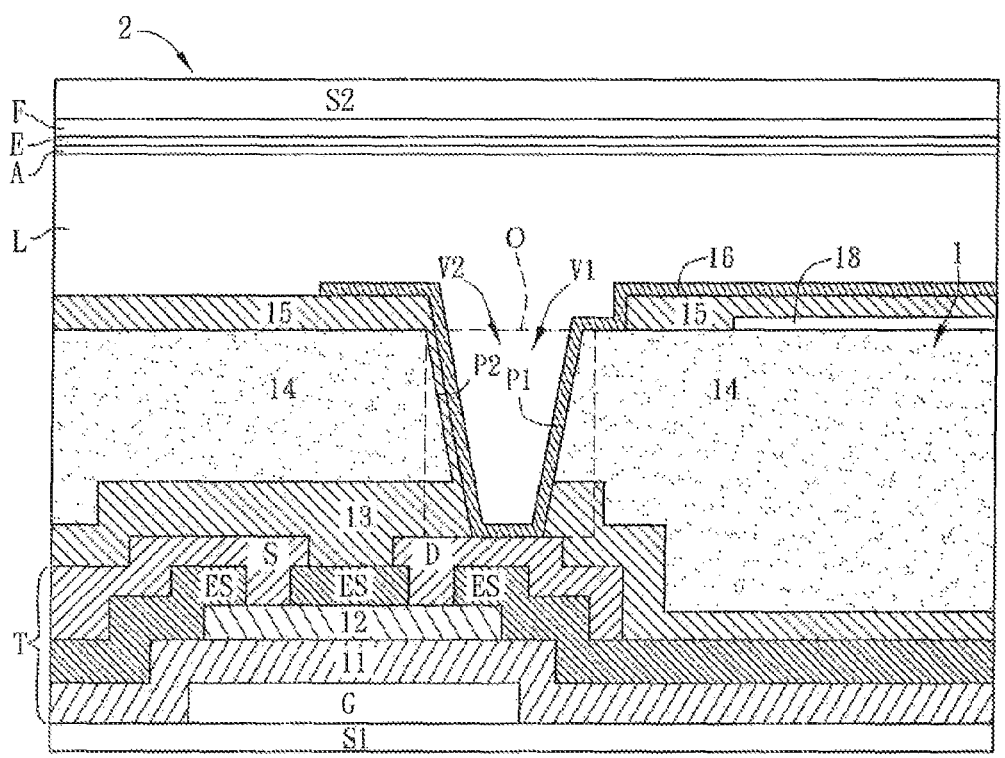
FIG. 4 is a schematic sectional diagram of a display panel according to an embodiment of the disclosure.

FIG. 4 is a schematic sectional diagram of a display panel 2 according to an embodiment of the disclosure.

In FIG. 4, the display panel 2 includes a TFT substrate 1, an opposite substrate. S2, and a liquid crystal layer L.

The TFT substrate 1 has been clearly illustrated in the above embodiments, and therefore it is not described here for concise purpose. The opposite substrate S2 is disposed opposite to the TFT substrate 1, and can optionally have an electrode layer E and an alignment layer A. The opposite substrate 52 can be made by transparent material, such as glass, quartz, or the like. As an embodiment, the substrate S1 of the TFT substrate 1 and the opposite substrate S2 can be made by different material. For example, the opposite substrate S2 is a potash glass substrate, and the substrate S1 is an alumino silicate glass substrate. The electrode layer E is disposed on a side of the opposite substrate S2 facing the TFT substrate 1, and the alignment layer A is disposed below the electrode layer E. Besides, a color filter layer F can be disposed between the opposite substrate S2 and the electrode layer E for achieving the colorful display. The liquid crystal layer L is disposed between the TFT substrate 1 and the opposite substrate S2.

Figure 5:
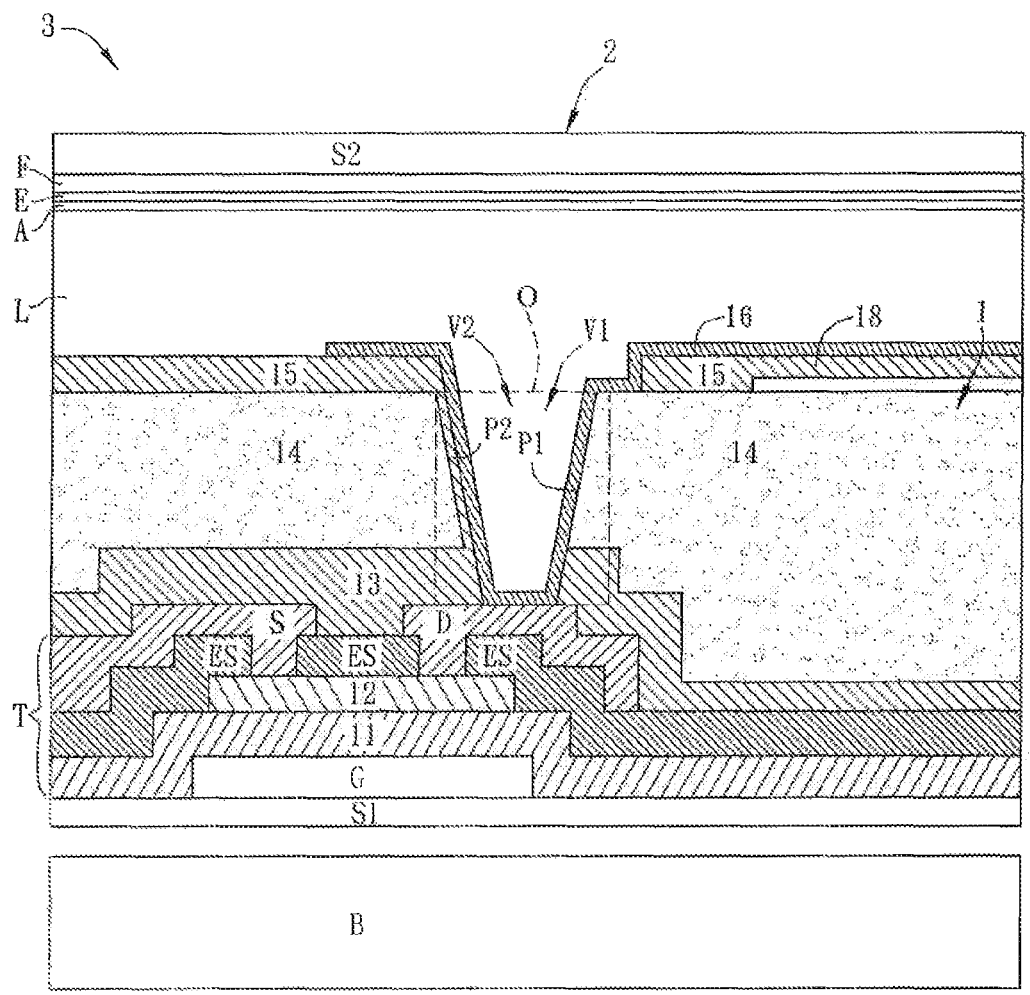
FIG. 5 is a schematic sectional diagram of a display apparatus according to an embodiment of the disclosure.

FIG. 5 is a schematic sectional diagram of a display apparatus 3 according to an embodiment of the disclosure.

In FIG. 5, the display apparatus 3 includes a display panel 2 and a backlight module B. The display panel 2 includes a TFT substrate 1, an opposite substrate S2 and a liquid crystal layer L. The TFT substrate 1 has been clearly illustrated in the above embodiments, and therefore it is not described here for concise purpose.

The opposite substrate S2 is disposed opposite to the TFT substrate 1, and can optionally have an electrode layer E and an alignment layer A. The opposite substrate S2 can be made by transparent material, such as glass, quartz, or the like. As an embodiment, the substrate S1 of the TFT substrate 1 and the opposite substrate S2 can be made by different material. For example, the opposite substrate S2 is a potash glass substrate, and the substrate S1 is an alumino silicate glass substrate. The electrode layer E is disposed on a side of the opposite substrate S2 facing the TFT substrate 1, and the alignment layer A is disposed below the electrode layer E. Besides, a color filter layer F can be disposed between the opposite substrate S2 and the electrode layer E for achieving the colorful display. The liquid crystal layer L is disposed between the TFT substrate 1 and the opposite substrate S2. To deserve to be mentioned, the source S and drain D of the thin film transistor T in FIGS. 4 and 5 are disposed on the etch stop layer ES, and respectively contact the channel layer 12 through the openings of the etch stop layer ES. The etch stop layer ES can be made by organic material such as organic silicone compound, or inorganic material such as silicon nitride, silicon oxide, silicon oxynitride, silicon carbide, aluminum oxide, hafnium oxide or their any combinations. The etch stop layer ES can be a single-layer or multi-layer structure. In other embodiments, the source S and the drain D can be directly disposed on the channel layer 12 instead of through the etch stop layer ES.

The backlight module B is disposed on a side of the TFT substrate 1 facing away from the opposite substrate S2, and emits light that passes through the substrate S1 of the TFT substrate 1 and the liquid crystal layer L sequentially and then is outputted from the opposite substrate S2.

In summary, according to a display panel and a display apparatus of the embodiments of the disclosure, the TFT substrate includes a first insulating layer and a planarization layer, the first insulating layer has a first via above the drain, the planarization layer has a second via above the drain, and the first via and the second via are partially overlapped to form an overlap portion. Besides, the pixel electrode layer is disposed on the second insulating layer and in the overlap portion to connect the drain. Thereby, in comparison with the conventional art, the overlap portion of the first and second vias according to the disclosure is less in dimensions, so that the coverage of the black matrix layer is reduced. Therefore, the display panel and the display apparatus according to the disclosure can have larger aperture ratio of the pixel.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A display panel, comprising:
a thin film transistor substrate, comprising:
a substrate;
a thin film transistor disposed on the substrate and having a drain;
a first insulating layer disposed on the drain and having a first via above the drain;
a planarization layer disposed on the first insulating layer and having a second via above the drain, wherein the first via and the second via are partially overlapped to form an overlap portion, and the ratio of the area of the overlap portion to the area of the first is 0.14~0.78;
a second insulating layer disposed on the planarization layer; and
a pixel electrode layer disposed on the second insulating layer and in the overlap portion to connect to the drain;
an opposite substrate disposed opposite to the thin film transistor substrate; and
a liquid crystal layer disposed between the thin film transistor substrate and the opposite substrate.

2. The display panel as recited in claim 1, wherein the area of the overlap portion is between 4 square microns and 49 square microns.

3. The display panel as recited in claim 1, wherein the ratio of the area of the overlap portion to the area of the second via is 0.14~0.78.

4. The display panel as recited in claim 1, wherein the width of the overlap portion is between 2 microns and 8 microns.

5. The display panel as recited in claim 1, wherein the thin film transistor further has an etch stop layer disposed below the drain.

6. The display panel as recited in claim 5, wherein the thin film transistor further has a channel layer disposed below the etch stop layer, and the drain contacts the channel layer through an opening of the etch stop layer.

7. The display panel as recited in claim 6, wherein the material of the channel layer includes an oxide semiconductor.

8. The display panel as recited in claim 1, wherein the thin film transistor substrate further includes a common electrode layer disposed between the planarization layer and the second insulating layer.

9. The display panel as recited in claim 1, wherein the thin film transistor substrate further includes a scan line, which has an indentation disposed corresponding to the overlap portion.

10. The display panel as recited in claim 1, wherein the overlap portion has a first edge, a portion of the pixel electrode layer is disposed at the first edge and contacts the planarization layer.

11. The display panel as recited in claim 10, wherein the overlap portion further has a second edge, a portion of the second insulating layer is disposed at the second edge and contacts the planarization layer.

12. A display apparatus, comprising:
a thin film transistor substrate including a substrate, a thin film transistor, a first insulating layer, a planarization layer, a second insulating layer and a pixel electrode layer, wherein the thin film transistor is disposed on the substrate and has a drain, the first insulating layer is disposed on the drain and has a first via above the drain, the planarization layer is disposed on the first insulating layer and has a second via above the drain, the first via and the second via are partially overlapped to form an overlap portion and the ratio of the area of the overlap portion to the area of the first via is 0.14~0.78, the second insulating layer is disposed on the planarization layer, and the pixel electrode layer is disposed on the second insulating layer and in the overlap portion to connect to the drain;
an opposite substrate disposed opposite to the thin film transistor substrate;
a liquid crystal layer disposed between the thin film transistor substrate and the opposite substrate; and
a backlight module disposed on a side of the thin film transistor substrate facing away from the Opposite substrate.

13. The display apparatus as recited in claim 12, wherein the area of the overlap portion is between 4 square microns and 49 square microns.

14. The display apparatus as recited in claim 12, wherein the ratio of the area of the overlap portion to the area of the second via is 0.14~0.78.

15. The display apparatus as recited in claim 12, wherein the width of the overlap portion is between 2 microns and 8 microns.

16. The display apparatus as recited in claim 12, wherein the thin film transistor substrate further includes a scan line, which has an indentation disposed corresponding to the overlap portion.

17. The display apparatus as recited in claim 12, wherein the overlap portion has first edge, a portion of the pixel electrode layer is disposed at the first edge and contacts the planarization layer.

18. The display apparatus as recited in claim 17, wherein the overlap portion further has a second edge, a portion of the second insulating layer is disposed at the second edge and contacts the planarization layer.

* * * * *